United States Patent [19]
Huntley, Jr. et al.

[11] Patent Number: 5,706,008
[45] Date of Patent: Jan. 6, 1998

[54] HIGH BANDWIDTH PARALLEL ANALOG-TO-DIGITAL CONVERTER

[75] Inventors: Roger B. Huntley, Jr.; Thomas E. Tice; Charles D. Lane, all of Greensboro, N.C.

[73] Assignee: Analog Devices, Inc., Norwood, Mass.

[21] Appl. No.: 609,651

[22] Filed: Mar. 1, 1996

[51] Int. Cl.$^6$ .................................... H03M 1/36
[52] U.S. Cl. ..................... 341/156; 341/159; 341/161
[58] Field of Search ........................... 341/155, 156, 341/157, 158, 159, 161

[56] References Cited

U.S. PATENT DOCUMENTS

| | | | |
|---|---|---|---|
| 4,737,766 | 4/1988 | Van De Plassche | 340/347 |
| 5,126,742 | 6/1992 | Schmidt et al. | 341/156 |
| 5,376,937 | 12/1994 | Colleran et al. | 341/159 |
| 5,387,914 | 2/1995 | Mangelsdorf | 341/156 |
| 5,416,484 | 5/1995 | Lofstrom | 341/159 |
| 5,444,447 | 8/1995 | Wingender | 341/156 |
| 5,471,210 | 11/1995 | Wingender et al. | 341/156 |
| 5,589,831 | 12/1996 | Knee | 341/159 |

FOREIGN PATENT DOCUMENTS

217120  7/1992  Japan .

OTHER PUBLICATIONS

Paul Horowitz, Winfield Hill, "Analog Digital Conversion", *The Art of Electronics*, Cambridge University Press, New York, 1989, pp. 621–622.

Daniel H. Sheingold, Ed., "Single-Channel Conversion Subsystems", *Analog to Digital Conversion Handbook*, Prentice Hall, Englewood Cliffs, New Jersey, 1986, pp. 22–23.

*Primary Examiner*—Marc S. Hoff
*Assistant Examiner*—Jason H. Vick
*Attorney, Agent, or Firm*—Koppel & Jacobs

[57] ABSTRACT

A new differential ladder/comparator circuit reduces settling time delays in parallel analog to digital converters. A parallel analog-to-digital converter (ADC) includes a pair of differential resistor ladders having their taps connected to a group of comparators. The comparators produce digital "thermometer" scale outputs corresponding to analog signals impressed upon the differential ladders. By employing double-value resistors to form the "rungs" of the ladders and by connecting the comparators to the ladder taps in a way that increases the number of comparator inputs connected to the ladders' lower-order taps and decreases the number of comparator inputs connected to the ladders' higher order taps, the input impedance presented by the ladder/comparator combination is reduced in comparison with conventional differential ladder parallel ADCs. Additionally, input signals are superimposed upon the ladders by drivers which, in a preferred embodiment, present lower output impedances to the ladders than prior art drivers, further improving the bandwidth of the ADC.

18 Claims, 7 Drawing Sheets

FIG. 4
(Prior Art)

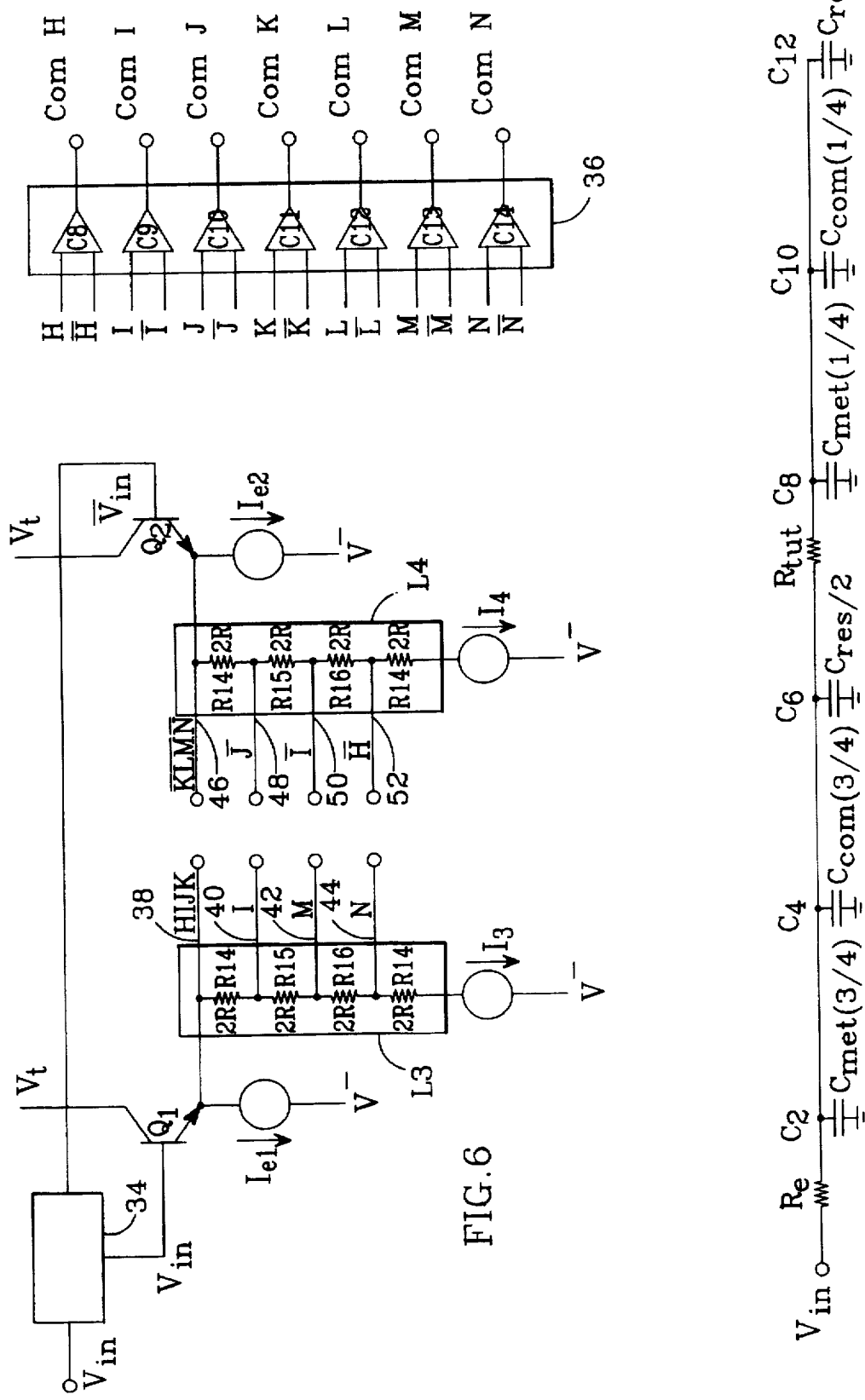

HIGH BANDWIDTH PARALLEL ANALOG-TO-DIGITAL CONVERTER

BACKGROUND OF THE INVENTION

1. Field of the Invention

The invention relates to analog-to-digital converters (ADCs) and, in particular, to integrated circuit parallel ADCs.

2. Description of the Related Art

Analog to digital converters are widely used at the interface between analog and digital systems. For example, analog audio signals in a recording studio are converted to digital format for recording in a compact disk, digital audio tape or other digital medium. Audio recording applications, because of their wide dynamic range and low frequency (humans generally don't hear signals beyond 20 KHz), require relatively high resolution but low bandwidth. Other application areas, such as video, require much higher speed conversion. A relatively simple ADC architecture, fully parallel, or "flash", provides the highest conversion speed of any ADC.

FIG. 1 illustrates the basic components of a conventional flash ADC. A bank of comparators 10 is connected to receive an analog signal from an analog input 12. The signal is distributed to the noninverting input of each comparator within the comparator bank 10. A resistor ladder 14, connected between voltage references +Vref and −Vref provides reference signals to each comparator's inverting input. The "rungs" of the resistor ladder are equal-valued resistors which, due to their equal values, provide equal voltage "steps" for comparison with the analog input voltage by the comparators 10.

An analog input signal that exceeds the voltage at the bottom of the resistance ladder, i.e., that at tap 1, will trip the bottom-most comparator COMP1. An analog input signal that exceeds the voltage at tap 2 will trip both comparators comp 1 and comp 2, one that exceeds the voltage at tap 3 will trip comparator 3, and so on.

This comparison process yields what is sometimes referred to as a "thermometer", or "thermometer scale" output at the outputs of the comparator bank. It would be impractical to leave the output in this "thermometer format; a 20-bit ADC such as may be employed in audio applications would require 1,048,576 outputs to represent all the comparator outputs. Therefore a priority encoder 16 is employed to encode the thermometer output into digital values and to latch the digital output using a strobe, labeled STROBE. Any one of several encoding schemes may be used, including offset binary, 2's complement, sign magnitude, Gray code and binary-coded-decimal (BCD).

The great advantage of a flash converter, such as the one just described, is that the only delays encountered in the conversion process are those attributable to the ladder/comparator stage and the encoder. The major disadvantage is the great number of resistors and comparators required for conversion. Not only does the enormous number of resistors and comparators required for a flash converter consume valuable "chip real estate", it is difficult to produce the low-valued resistors required for a monolithic flash converter while maintaining the resistor-matching characteristics required for accurate performance.

The basic parallel ADC architecture just described is employed as a component in a number of other types of ADCs including subranging, successive approximation, etc. Flash ADCs and subranging ADCs are discussed in Paul Horowitz, Winfield Hill, *The Art of Electronics*, Cambridge University Press, New York, 1989, pages 621 and 622. For example, a flash ADC is employed in the somewhat slower subranging ADC illustrated in FIG. 2. An analog signal is introduced to the ADC's track and hold 18, which basically "takes a snapshot" of the analog input signal which may be varying rapidly. An N-bit flash converter 20 and a summing amplifier 23 are connected to receive the analog signal held by the track and hold. The N-bit flash converter 20 converts the analog input from the track and hold 18 in the manner just described in relation to FIG. 1.

The N-bit (encoded) digital value at the output of the ADC 20 comprise the N most significant bits of the 2N-bit subranging converter. The N-bit output is connected to a digital to analog converter (DAC) 22 which provides greater than 2N bits of accuracy. The analog output from the DAC is subtracted from the original signal, and the remainder, or residue, is amplified and applied to another N-bit flash ADC 24. The converter 24 provides the lowest N significant bits of the overall ADC output. Rather than employ an additional ADC 24, the residue may be fed back to the ADC 20. Additionally, the ADCs 20 and 24 needn't have the same resolution.

Parallel ADCs are sometimes implemented using the differential ladder structure of FIG. 3. A signal conversion circuit 26 converts a single-ended analog input signal Vin into differential signals, Vin and $\overline{\text{Vin}}$, having the same and opposite polarities, respectively, as the original signal Vin. These signals are connected to differential ladders L1 and L2 comprising resistors R1–R6 and R7–R12, respectively. Resistor ladder L1 provides output taps A–G, ladder L2 provides taps $\overline{\text{G}}$–$\overline{\text{A}}$. Current sources I1 and I2 draw current through ladders L1 and L2, respectively. Ladders such as L1 and L2 will be referred to hereinafter as single-valued ladders. As will be described in greater detail in relation to FIG. 4, the voltage drop across the entire ladder due to the current sources determines the input voltage range of a parallel ADC based upon this differential ladder circuit. Similarly, the resolution of the ADC is determined by the voltage drop across each individual resistor in, or rung of, the ladders L1 and L2. In a first order analysis, the current sources I1 and I2 are assumed to be ideal current sources and the outputs Vin and $\overline{\text{Vin}}$ from the conversion circuit 26 are supplied by ideal voltage sources. Half the ladder taps, those most directly connected to the conversion circuit 26, will be referred to hereinafter as the "lower-order taps", the tap most directly connected to the conversion circuit will be referred to as the "lowest-order tap" and the remaining taps will be referred to as "higher-order taps".

A bank of comparators 30, comprising comparators C1–C7, provides a "thermometer" output as described in relation to FIG. 2. That is, the output ComG from comparator C7 is responsive to the lowest level of analog input signal that will produce a change in the digital output, while that ComA from comparator C1, ComA is responsive to the highest level analog signal that will produce a change in the digital output. Outputs ComF–ComB from comparators C6–C2, respectively, form intermediate outputs in increasing order of digital value. Taps from the differential ladders are connected to corresponding comparators inputs, i.e., taps A from L1 and $\overline{\text{A}}$ from L2 are connected to the inputs of comparator C1, which forms output ComA in response.

The operation of the differential ladder/comparator bank combination of FIG. 3 will now be explained in greater detail, with reference to the chart of FIG. 4. It is assumed that each rung of the ladders, L1 and L2, has a voltage drop of 1V (e.g., 1 kohm resistor and 1 mA current source), yielding a total drop across each ladder of 6V and a resolution of 1V. The voltages, −9V through 3V, listed along the left-hand side of the chart represent voltages which the ladder taps of ladders L1 and L2 may assume. To the right of this column of voltages appear seven double-width columns representing the voltages at all the various ladder taps for each value of input voltage Vin=3V through Vin=−3V. The value of Vin appears at the top of each column. Below each double-width column is a single column containing the digital values of the comparator outputs ComA–ComG for each value of input voltage.

Again, it is assumed that the conversion circuit 26 provides ideal voltage sources to drive Vin and $\overline{\text{Vin}}$, and that current sources I1 and I2 are ideal current sources. Therefore, whatever signal voltage is presented to the input of circuit 26 is impressed upon tap A, and the voltage of the entire ladder L1 is shifted downward by a like amount. Similarly, the input to the circuit 26 is inverted and impressed upon tap $\overline{G}$ of ladder L2 and the voltage of ladder L2 is shifted downward by that amount. Given a value of 3V for Vin, for example, ladder tap A will have a value of 3V, B will be 2V, C will be 1V, etc. and ladder tap $\overline{G}$ will equal −3v, $\overline{F}$ will be −4V, $\overline{E}$ will be −5V, etc. The outputs of the comparators of comparator bank 30 will be as listed at the bottom of the chart. That is, for Vin=3V, ComA through ComF all equal 1, because the signals at the noninverting inputs A–F are greater than those at the inverting inputs $\overline{F}$–$\overline{A}$. Taps G and $\overline{G}$ will be equal, so the output comG will be at the "trip" level represented by a T in the chart entry. A slightly lower value of input voltage Vin will assure a value of 0V for output ComG.

As noted in relation to the discussion of FIG. 1, although parallel ADCs provide the fastest conversion architecture of any ADC, their speed is often limited by delays in the ladder/comparator circuit and in the encoder. Various digital design and layout techniques have been employed to minimize delays within the encoder, but the ladder/comparator circuit contributes a substantial delay to an ADC's conversion. This delay is related to the impedance presented by the ladder/comparator circuit to an input analog signal. This impedance is dominated by the resistance and distributed capacitances of the ladder/comparator circuit.

Any isolated region of an integrated circuit having two contacts may be used as a resistor. The resistance of such a resistor depends upon the doping levels of the region and the dimensions of the resistor. That is, the resistance of an integrated circuit resistor is given by:

$$R=(Rs)(l/w)$$

Where:

Rs=square resistance, in Ohms
l=the length of the resistor
w=the width of the resistor As noted above, Rs depends upon the doping level of the region being employed as a resistor. The lengths and widths of the resistors are also limited: at one extreme by the surface area available upon the integrated circuit which incorporates them and, at the other extreme, by the smallest dimension of a resistor region that may be reliably reproduced. Suppose, for example, Rs=150 and the minimum reliably reproducible resistor dimension, i.e., the minimum width which permits acceptable matching of resistors, is 15 µm. Given these values, a $1E^6\Omega$ resistor (where $E^6$ means $*10^6$), for example, would require an area 100 centimeters long by 15 microns wide, consuming a total of 0.15 square centimeters. At the other extreme, the smallest resistor achievable within these confines would yield 150Ω, and occupy a 15 micron by 15 micron square. To obtain lower values of resistance, two resistors would have to be connected in parallel, i.e., two 15 micron by 15 micron resistors connected in parallel would yield a 75Ω resistor.

The disadvantage of a single resistor that occupies 0.15 square centimeters is obvious; the disadvantages of connecting resistors in parallel to obtain lower resistance values at the lower end of the resistance scale may be somewhat more subtle. The area occupied by such a resistor is twice that which would be occupied by a resistor formed of a "single line" of resistor squares. Additionally, each integrated circuit resistor has a distributed capacitance associated with it. The value of this capacitance is proportional to the surface area occupied by the resistor. Doubling the surface area required to produce a resistor doubles the capacitance associated with the resistor.

Additional capacitance, attributable to the metallization used to interconnect the ladders' resistors with the comparators, also contributes a significant amount of capacitance to the ladder/comparator circuit's input impedance, thereby limiting the conversion speed of an associated ADC. Further speed-limiting capacitance is due to the comparators' input capacitance, e.g., the base/emitter and base/collector capacitance of the comparators' input stages.

Delays within the ladder/comparator circuit may be better understood with reference to the circuit of FIG. 5A. An input signal Vin, the signal of the same name provided by conversion circuit 26 of FIG. 3, is connected through a resistor Rin to the "top" of resistor ladder L1. The resistor Rin represents the resistance between the ideal voltage source of circuit 26 and the "top" of the ladder L1, i.e., tap A. The series combination of resistors R1–R6 has three capacitances, Cmet, Cres, and Ccom, shown in FIG. 5A, associated with each resistor in the ladder. These capacitances are attributable to: the metallization required to connect a ladder tap to a comparator and the resistors to one another, the distributed capacitance of a resistor, and the capacitance of a comparator input, respectively. The ladder L1 would, for example, include six resistors (excluding Rin) and twenty capacitances, i.e. six capacitances associated with the resistors R1–R6, seven with the metallization paths from the ladder taps to the comparators, and seven with the comparator inputs.

A simplified model of the ladder/comparator impedances is illustrated in FIG. 5B. A basic assumption inherent in the model is that the capacitances are approximately evenly distributed. Consistent with this model, the input Vin is connected to a cascade of low pass filters, the first formed by the RC combination of Rin and ½(CresT+CcomT+CmetT), where CresT, CcomT, CmetT are the total capacitances attributable to all the resistors, all the comparator inputs, and all the metallization, respectively. This filter is followed by another, consisting of the RC combination of Rtot and ½(CresT+CcomT+CmetT), where Rtot is the total resistance of the ladder.

The delay attributable to a ladder/comparator bank combination may be thought of in terms of the RC filters' settling time. As an example, assume an ADC must provide eight bits of accuracy with no more than 10 nsec delay attributable to the ladder/comparator combination. Eight bits of accuracy is equivalent to one part in 256, or 0.0039. Allowing a ten percent margin, the goal, then, is to have the RC circuit settle to within 0.35% of its final value within 10 nsec. The voltage across the filter capacitor, Vcap, is given by the expression:

$$Vcap=Vin\,(1-e^{-t/RC})$$

where:

Vin=voltage at the input of the low pass filter t=time in seconds

R=resistance in Ohms of the low pass filter

C=capacitance in Farads of the low pass filter

The above requirement, that the RC circuit settle to within 0.35% of its final value within 10 nsec, is equivalent to requiring that $e^{-t/Rc} \leq 0.0035$ when $t \geq 10$ nsec., or that $t=5.65$ RC. In this case, t is prescribed to be 10 nsec. Assuming that the value of each resistor in the ladder, and the values of capacitance attributable to each resistor, to the metal interconnect for each resistor, and to each comparator input are as follows:

$$Cres=120E^{-18}$$

$$Ccom=120E^{-18}$$

$$Cmet=350E^{-18}$$

$$R=150\Omega$$

and that, in a first order analysis, the contribution of the input resistor, Rin, may be neglected. The value of RC is given by the following expression:

$$RC = (150)(256)[(256)(120\,E^{-18} + 120\,E^{-18} + 350\,E^{-18})]^{1/2}$$
$$= 2.9\,E^{-9}$$

this yields a settling time, t, of:

$$(2.9\,E^{-9})(5.65)=16.4 \text{ nsec}.$$

That is, the circuit is too slow by nearly a factor of two.

A useful figure of merit for ADCs is the maximum frequency sinewave signal that may be converted with 1 LSB accuracy. A development of this figure is presented in *Analog to digital conversion Handbook*, Daniel H. Sheingold Ed., Prentice Hall, Englewood Cliffs, N.J., 1986 pages 22–23. For a given delay, T, between conversions, and bits of resolution n, the maximum sinewave frequency, fmax is given by the expression:

$$fmax=2^{-n}/T\pi$$

where:

fmax=maximum sinewave frequency n=resolution of converter, in number of bits

T=time between conversions, in seconds

Using the 16.4 nsec. derived above for the ladder's settling time and adding 5 nsec. to account for additional converter delays, such as those attributable to an ADC's encoder, yields a minimum time between conversions, T, of approximately 22 nsec. for an ADC employing the ladder/comparator bank of this example. The maximum conversion frequency would therefore be:

$$fmax = 2^{-8}/22\,E^{-9}\pi$$
$$= 56.52 \text{ khz}$$

Another figure of merit that may be employed quite naturally in conjunction with the above lowpass filter model is the filter's bandwidth:

$$BW=\frac{1}{2\pi RC}$$

Given the above RC time constant, the filter's bandwidth is 54.9 MHZ. One must keep in mind that the above expression is for a 3 dB bandwidth. That is, the amplitude of a 54.9 MHZ signal would be reduced to approximately 70% of its input value at the input to the comparators. Clearly, this is unacceptable in many ADC applications. Nevertheless, keeping this caveat in mind, bandwidth is a useful and widely used figure of merit which permits ready comparisons among ADCs.

The conversion speeds of ADCs are therefore limited, in part, by the capacitance associated with distributed resistors, by the capacitance associated with the metallization used to interconnect resistor ladders and comparator banks, and with the capacitance associated with comparator inputs. Resistances associated with the ladder drivers and the ladder resistances combine with these capacitances to, in a sense, lowpass filter analog signals presented to the ADCs for conversion. This unfortunate lowpass filtering limits the conversion speed of ADCs and, correspondingly, the type of signals, e.g., audio, video, radar, lidar, etc., that may be converted using a given ADC.

SUMMARY OF THE INVENTION

The invention is directed to a ladder/comparator circuit having reduced input impedance in comparison to conventional ladder/comparator circuits. This reduction of input impedance increases an associated converter's conversion speed.

An ADC which incorporates the new ladder/comparator circuit reduces the impedance presented to an input signal by reducing the output impedance of the resistor ladder driver, by reducing the capacitance associated with the metallization used to interconnect the resistor ladder and comparator bank and, by interconnecting the ladder taps and comparator inputs in a novel way, and by reducing the "effective capacitance" of the ladder/comparator bank.

In one embodiment, a differential ladder pair is connected to a bank of comparators to provide, basically, a "thermometer" output. The rungs of the differential ladders are formed of resistors, each resistor having twice the resistance that a resistor within a single-valued ladder of the same resolution would have but, with each ladder including half as many resistors, the total ladder resistance is the same. Additionally, a higher proportion of the comparator inputs are connected to lower-order ladder taps, and a lower proportion of comparators are connected to higher-order ladder taps than in conventional dual differential ladders. This reduces the effective capacitance of the ladder, thus permitting higher-speed operation. In the preferred embodiment an encoder encodes the thermometer output from the comparators as a binary value corresponding to the analog input voltage. Each ladder has an associated current source connected to determine the amount of current drawn through and, therefore, the voltage across the ladder resistors.

The differential ladder pair also includes drivers which supply the ladders with a fixed current and which superpose the analog input voltage upon the ladders. In one embodiment, these drivers comprise bipolar transistors connected in an emitter follower configuration with the emitters connected to a supplemental current source which reduces the drivers' output impedance.

The new differential ladder pair may be employed by any parallel ADC, including flash converters, subranging converters, etc. and may incorporate further impedance reduction.

These and other features, aspects and advantages of the invention will be apparent to those skilled in the art from the following detailed description, taken together with the accompanying drawings.

BRIEF DESCRIPTION OF THE DRAWINGS

FIG. 4 is a chart which illustrates the voltages at the various resistor ladder taps of FIG. 3 and the output state of the related comparators for given values of voltage appearing at the input to the differential ladder.

FIG. 6 is a schematic diagram of the novel differential resistor ladder which illustrates the interconnection of ladder taps and comparator inputs.

FIG. 8 is a simplified impedance model of the resistor ladder/comparator bank of FIG. 6.

DETAILED DESCRIPTION OF THE INVENTION

The schematic diagram of FIG. 6 illustrate the new resistor ladder/comparator circuit. An input signal Vin is received by a conversion circuit 34 that converts the signal from single-ended to differential form, providing signals Vin and $\overline{\text{Vin}}$. These signals are connected to drive the bases of npn transistors Q1 and Q2, respectively. Transistors Q1 and Q2 are connected as emitter followers, having their collectors connected to a positive supply voltage $V^+$ and their emitters connected, through current sources Ie1 and Ie2, respectively, to a negative supply voltage $V^-$. Transistors Q1 and Q2 operate as ladder drivers, providing low output impedance drive capability to resistor ladders L3 and L4, respectively.

As discussed in greater detail below, current sources Ie1 and Ie2 reduce the output impedances of the transistors Q1 and Q2, thereby increasing the speed with which ladders L3 and L4 may be driven. The resistor ladders L3 and L4 include series connected resistors R14–R16 and R17–R19, respectively. The resistor ladders L3 and L4 are double-valued resistor ladders. That is, each resistor R14–R19 has twice the resistance of a similar (i.e., having the same resolution, the same input range, and same value of ladder current source) prior art single-valued ladder, such as that of FIG. 3, would have. Additionally, the number of ladder resistors is reduced to ½N, where N=the number of resistors within a single-valued ladder. Current sources I3 and I4 provide a fixed voltage drop across the ladders L3 and L4, respectively. The ladder taps 38–44 and 46–52 for ladders L3 and L4 respectively, are connected, as indicated, to comparator inputs having the same labels within comparator bank 36, i.e., the lowest order tap of ladder L3, tap 38 is connected to inputs H, I, J and K, of the comparator bank 36, the second-lowest order tap of L3, tap 40, is connected to input L of the comparator bank 36, etc.

Figure 3:
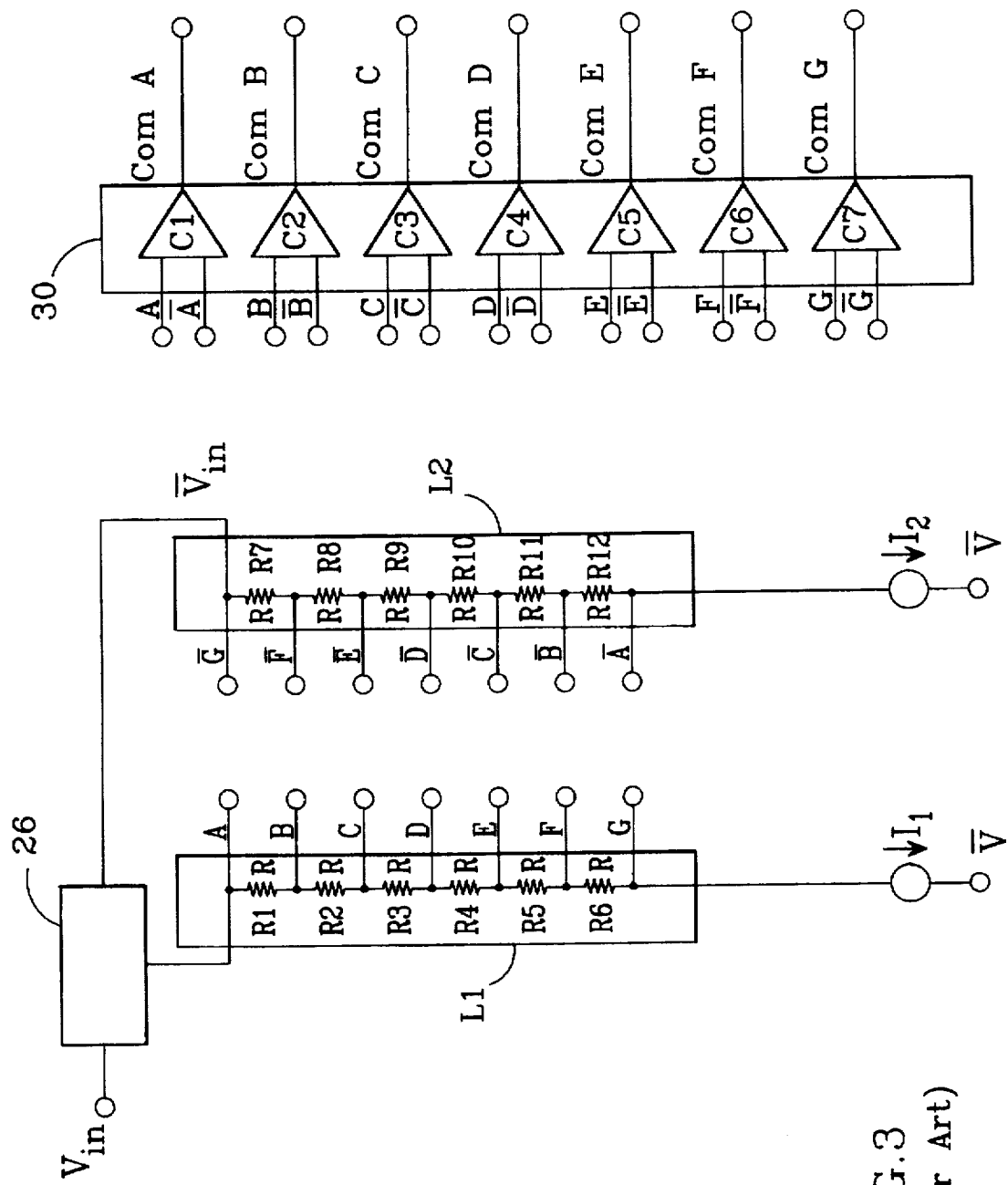
FIG. 3 is a circuit diagram which illustrates the operation of a conventional differential ladder/comparator bank that may be employed by an ADC.

Since the total resistance in each ladder L3 and L4 equals the total resistance in each ladder L1 and L2, to provide the same input voltage range as the single-valued ladders of FIG. 3, the current sources I3 and I4 would need the same value as the current sources I1 and I2. Additionally, as will be discussed in relation to FIG. 7, the ladders L3 and L4, in combination with the comparator bank 36, provide the same resolution as a single-valued ladder/comparator circuit.

Returning now to the operation of current sources Ie1 and Ie2; the emitter resistance of an npn transistor such as Q1 or Q2 is given by the expression:

$$Re = (kT/q)/(Ic)$$

where:

Ic=the transistor's collector current k=Boltzman's constant

T=Kelvin temperature q=charge of an electron

At room temperature (kT/q) is approximately equal to 25.3 mV. Additionally, in this circuit the transistors' base current is negligible, so that the collector current Ic approximately equals the emitter current. As discussed in relation to FIG. 3, the current through conventional resistor ladder drivers is determined by a current source which pulls current through the ladder and thereby fixes the total voltage drop across the ladder and the voltage drops for each rung of the ladder. Similarly, current sources I3 and I4 determine the total voltage drop across ladders L3 and L4 and the voltage drops for each rung of the ladder. However, in the new ladder circuit, the current drawn through the ladder drivers (Q1 and Q2 in this embodiment) is the combination of the ladder current source and the emitter current source Ie1 for Q1 and Ie2 for Q2. The emitter current sources Ie1 and Ie2 therefore reduce the output impedances of the ladder drivers. For example, with typical values of 100 μA and 400 μA for the ladder current sources I3 and I4 and emitter current sources Ie1 and Ie2, respectively, the ladder driver output impedance Re drops from approximately 250Ω without the emitter current source to 50Ω when the emitter current source is added. Because the emitter current sources Ie1 and Ie2 do not flow through the resistor ladders, they have no effect upon the resolution or input voltage range of an ADC which employs them.

Figure 1:
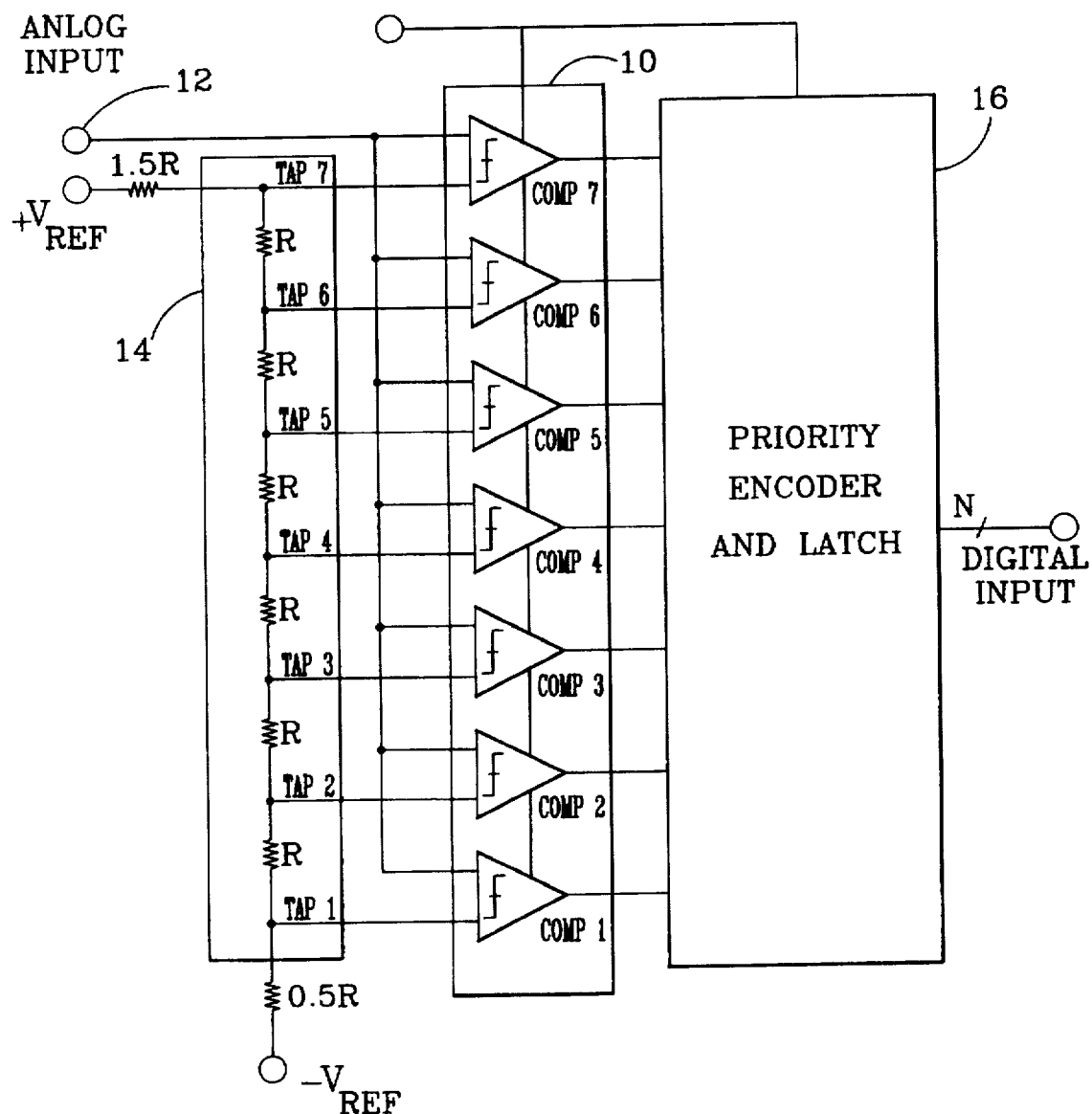
FIG. 1 is a block diagram illustrating the architecture of a conventional flash analog-to-digital converter.
Figure 2:
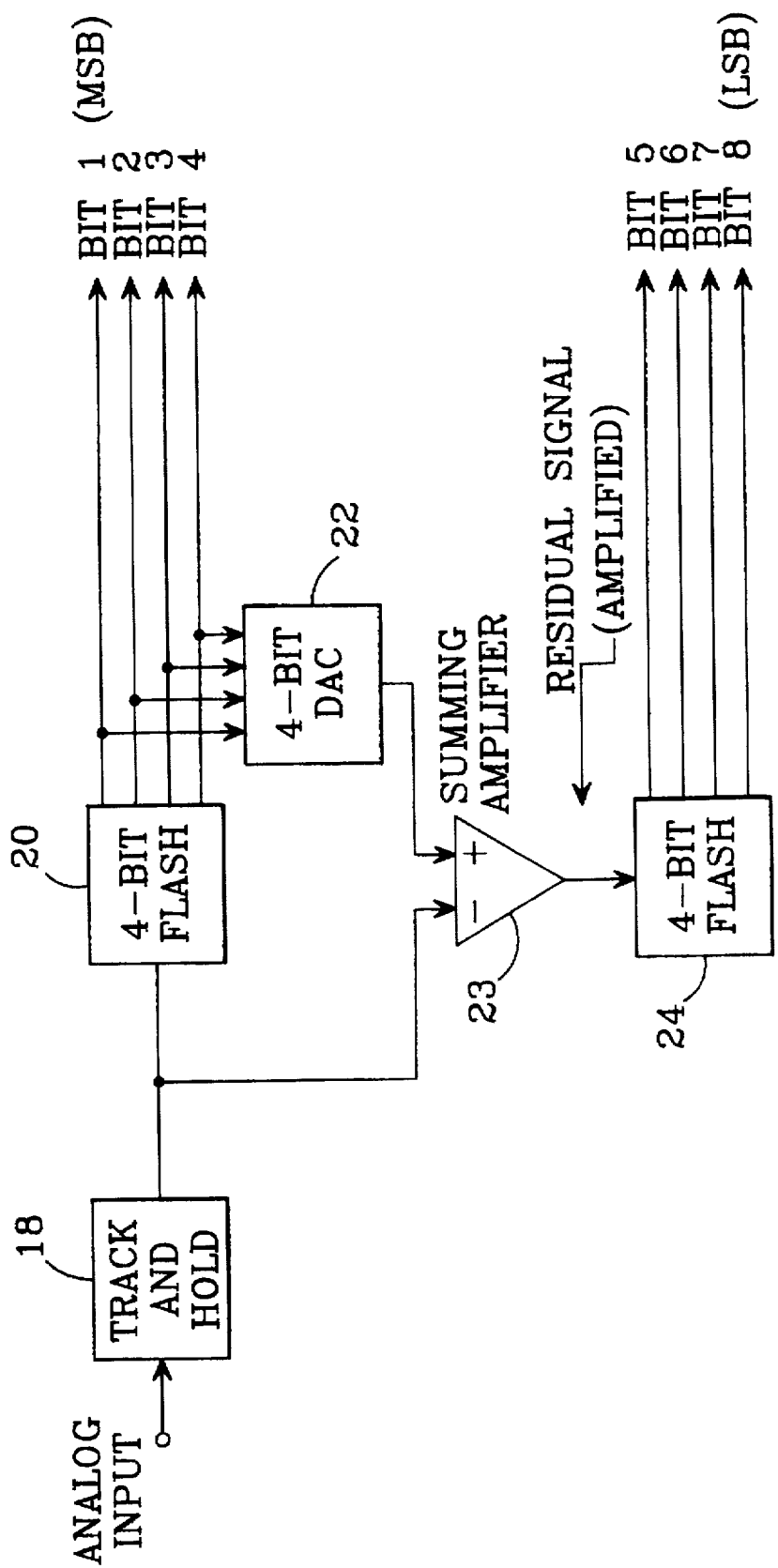
FIG. 2 is a block diagram illustrating the architecture of a conventional subranging ADC.

The bank of comparators 36, comprising comparators C8–C14, provides a "thermometer" output as described in relation to FIG. 2. That is, the output ComN from comparator C14 is responsive to the lowest level of analog input signal that will produce a change in the digital output, while that from comparator C8, ComH, is the highest order output. Outputs ComM–ComI from comparators C13–C9, respectively, form intermediate level outputs in increasing order of digital value.

Figure 7:
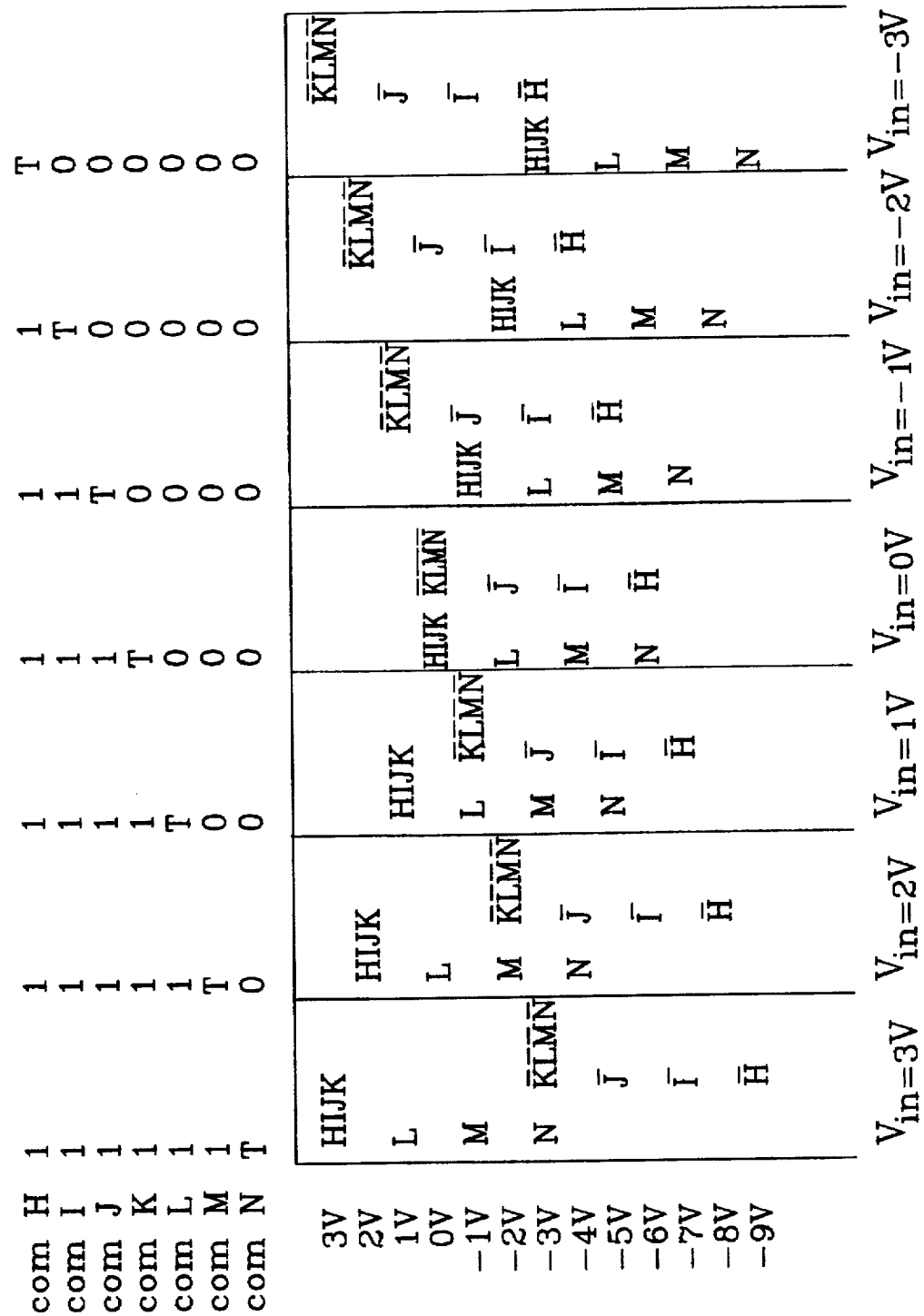
FIG. 7 is a chart which illustrates the voltages at the various resistor ladder taps of FIG. 6 and the output state of the related comparators for given values of voltage appearing at the input to the differential ladder.

The operation of the differential ladder/comparator circuit of FIG. 6 will now be explained in greater detail, with reference to the chart of FIG. 7. It is assumed that each rung of the ladders L1 and L2 has a voltage drop of 2V (e.g., 2 kohm resistor and 1mA current source), yielding a total drop across each ladder of 6V and a combined ladder resolution of 1V. The voltages, −9V through 3V, listed along the left-hand side of the chart represent voltages which the ladder taps of ladders L3 and L4 may assume. To the right of this column of voltages appear seven double-width columns representing the voltages at all the various ladder taps for each value of input voltage, i.e., Vin=3V through Vin= −3V. The value of Vin appears at the bottom of each column. Above each double-width column is a single column containing the digital values of the comparator outputs ComH-−ComN for each value of input voltage.

For purposes of this discussion, the outputs of the conversion circuit 34 are assumed to be ideal voltage sources which drive the ladders L3 and L4, and that current sources I1 and I2 are ideal current sources. That is, the output impedances of the transistors Q1 and Q2 will be ignored for now. With these assumptions in mind, whatever signal voltage is presented to the input of the conversion circuit 34 is impressed upon the lowest order tap 38 (connected to comparator bank inputs H I J and K) and the voltage of the entire ladder L3 is shifted downward by a like amount. Similarly, the input to the circuit 34 is inverted and impressed upon the lowest order tap 46(connected to inputs $\overline{K}$, $\overline{L}$, $\overline{M}$ and $\overline{N}$) of ladder L4 and the voltage of ladder L4 is shifted downward by that amount. Given a value of 3V for Vin, for example, ladder tap 38 will have a value of 3V, while taps 40–44 will have values of 1V, −1V, and −3V, respectively. Similarly, ladder taps 46–52 will have values of −3V, −5V, −7V, and −9V, respectively. The outputs of the comparator bank 36 will be as listed. That is, for Vin=3V, ComM through ComH all equal 1, because the signals at the noninverting inputs H–N are greater than those at the inverting inputs $\overline{H}$–$\overline{M}$. Taps 46 and 44 (connected to inputs N and $\overline{N}$) will be equal, so the output ComN will be at the "trip" level represented by a T in the chart entry. A slightly lower value of input voltage Vin will assure a value of 0V for output ComN.

Figure 4:
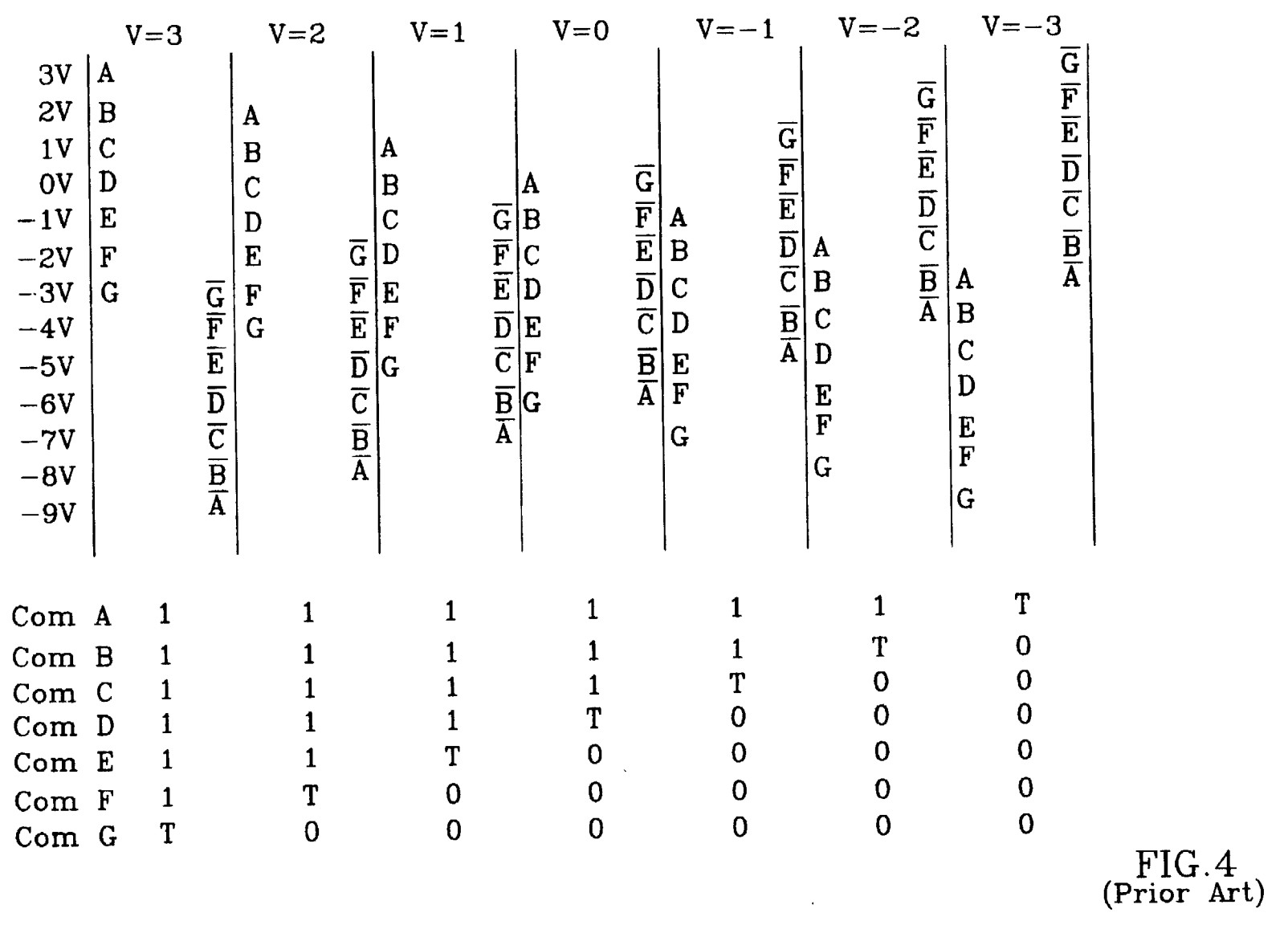

Comparing the input and output values of this chart with those of the chart of FIG. 4 will confirm that, although the ladder resistance values are different and the connections between ladder taps and comparators are substantially different, identical input values to the differential ladders yield identical comparator outputs. As noted above, a major advantage of the new ladder/comparator circuit is the reduction, compared to that of conventional ladder/ comparator circuits, of the impedance presented to an input signal.

There are a number of effects that contribute to this impedance reduction. The area occupied by the ladder resistors may, in some circumstances, be reduced by 75%. Suppose, for example, that a conventional ladder of 2N rungs is made up of 4N resistors, with each rung formed by two resistors connected in parallel. The available sheet resistance and the resolution of an associated ADC may require the use of two resistors connected in parallel to provide sufficiently low-level resistance for each rung. A comparable new ladder would require half the number of rungs, with each rung made of only one resistor, i.e., to provide twice the resistance for each rung one of the parallel-connected resistors would be eliminated. The total area devoted to ladder resistors would be only 25% of the area required for a single-valued resistor ladder. Consequently, the capacitance associated with the ladder resistors would also be reduced to 25% of that for a single-valued ladder. Similarly, due to the simpler interconnection of ladders and comparators within the new ladder/ comparator bank combination, the capacitance associated with the metal interconnection is also reduced. As previously explained, the driver, or emitter, current sources Ie1 and Ie2 reduce the output resistances of the ladder drivers. Finally, by connecting the inputs of higher order comparators to lower order ladder taps, the effective impedance (which will be discussed in relation to FIG. 8) of the ladder/comparator is reduced even further.

These impedance reductions and their advantages may be better understood in relation to the lowpass filter model of FIG. 8. An input signal Vin is introduced, through a resistor Re, to a lowpass RC filter representing the impedances of a ladder such as L3 or L4. The resistor Re represents the emitter resistance of a bipolar transistor, such as Q1 or Q2 of FIG. 6, employed as a ladder driver. A resistor Rtot, which represents the total resistance of a new resistor ladder such as ladder L3 or L4 of FIG. 6, is connected in series with Re. Capacitors C2, C4 and C6 are connected in parallel from the junction of the resistors Re and Rtot, i.e., the lower-order side of the resistor Rtot (representing the half of resistor ladder taps most directly connected to the ladder drivers) to ground. Capacitors C8, C10 and C12 are connected between the higher-order side of the resistor Rtot and ground.

In a first order analysis, the contribution of Re will be ignored. Capacitors C2, C4 and C6 represent the portion of total distributed metallization CmetT, comparator input CcomT, and resistor CresT, capacitance, respectively, connected to the lower order side of the resistor Rtot. Capacitors C8, C10, and C12 represent the portion of total distributed metallization CmetT, comparator input CcomT, and resistor CresT, capacitance, respectively, connected to the higher order side of the resistor Rtot. As a result of the novel interconnection illustrated in FIG. 6 approximately 75% of the metallization capacitance CmetT is distributed on the lower order side of the resistor Rtot. This is in contrast to 50% using conventional interconnection schemes, as discussed in relation to FIG. 5B.

Similarly, approximately 75% of the comparator input capacitance CcomT is distributed on the lower-order side of the resistor Rtot, in contrast to 50% of CcomT on the lower order side of the resistor Rtot when a conventional interconnection scheme is employed. As with conventional interconnection schemes, half the resistor capacitance is distributed on the lower-order side of the resistor Rtot. The remaining capacitance, 25% of CmetT, 25% of CcomT and 50% of CresT, is distributed on the higher order side of Rtot.

Figure 5A:
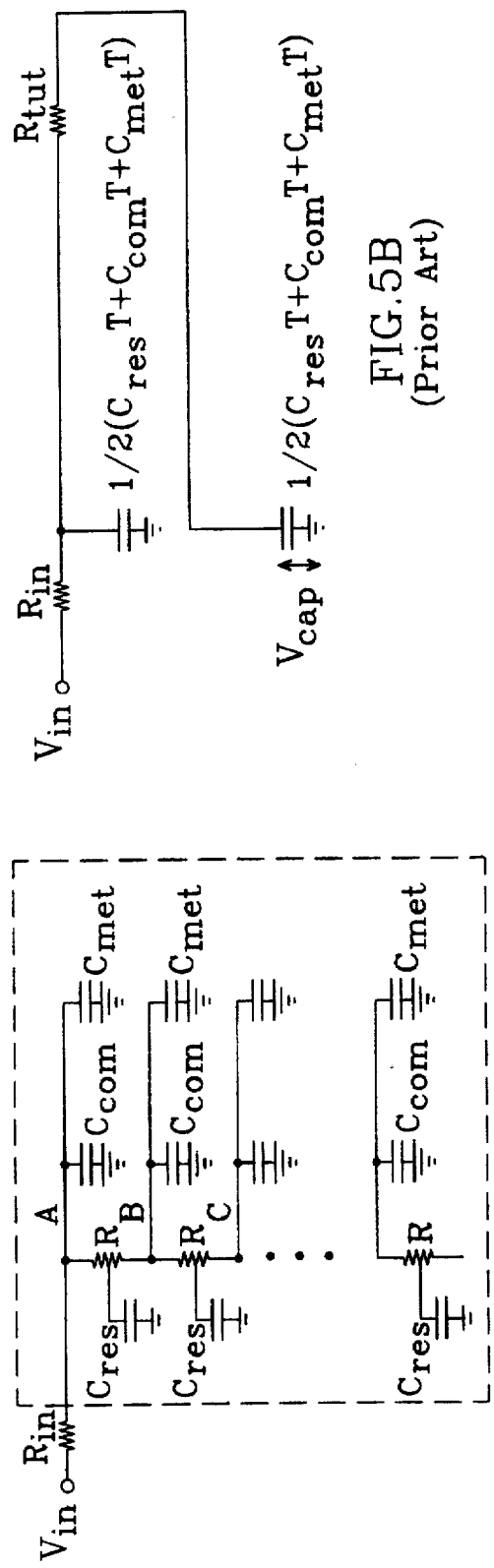
FIG. 5A is a model of the impedances associated with various components of the conventional resistor ladder/comparator bank of FIG. 3.
Figure 5B:
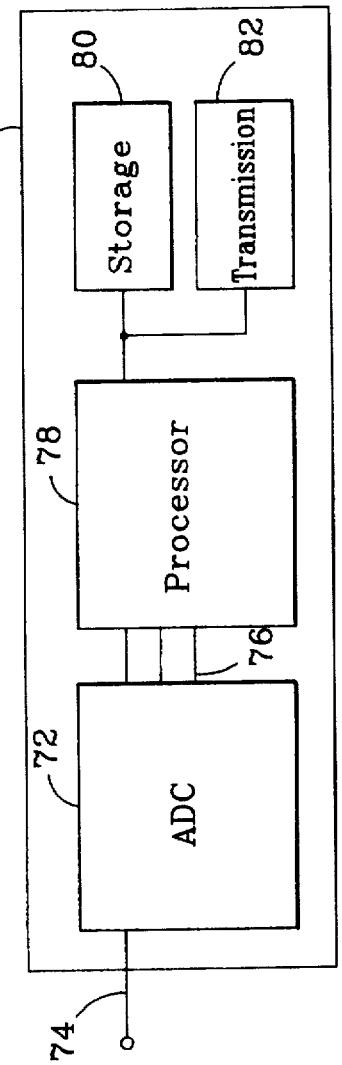
FIG. 5B is a simplified impedance model of the resistor ladder/comparator bank of FIG. 3.

Still neglecting, for now, the effect of Re, an approximation of conversion speed may be obtained for the new ladder/comparator circuit using the same lowpass RC filter model as in the analysis of conventional ladders in relation to FIG. 5B. Suppose, once again, that it is desired to have the input voltage to the comparator bank settle to within 1 bit in an 8-bit converter within 10 nsec. Assuming that CresT is half that of a conventional ladder, that CcomT remains the same, and that CmetT is reduced by two-thirds, the expression for RC becomes:

$$RC = (300)(128)[(.5)(.5)(120\,E^{-18})(128) + (.25)(120\,E^{-18})(256) +$$

$$(.25)(.33)(350\,E^{-18})256)]$$

$$= 725.7\,E^{-12}$$

which yields a settling time t of:

$$(725.7E^{-12})\,(5.65) = 4.1E^{-9},$$

which is substantially better than the targeted 10 nsec settling time. Thus, the novel interconnection of differential resistor ladder taps and comparator inputs reduces the effective impedance, i.e., the impedance presented to an incoming analog signal.

Assuming, as with the conventional circuit example related to the discussion of FIG. 5B, that additional delays, such as those due to an ADC's encoder, introduce another 5 nsec. of delay, then the minimum time between conversions would be 9.1 nsec. and the maximum frequency sinewave that an eight-bit ADC could convert with one-bit accuracy would be:

$$f_{max} = 2^{-n}/T\pi$$
$$= 137 \text{ KHz}$$

The 3 dB bandwidth would be:

$$BW=\frac{1}{2\pi RC}$$

$$=219 \text{ MHZ}$$

Further improvements in conversion speed may be obtained through the reduction of Re which, up to this point in the example, has been ignored. Given a typical ladder current of 100 μA, Re is approximately 250Ω at room temperature. This is substantially less than the total ladder resistance(25 kΩ in this example); nevertheless, this additional resistance does increase the ladder's settling time. The emitter current sources of the novel ladder/comparator circuit can reduce Re substantially. As described in relation to FIG. 6, an additional 400 μA of collector current through the ladder drivers reduces Re from 250Ω to 50Ω.

Figure 9:
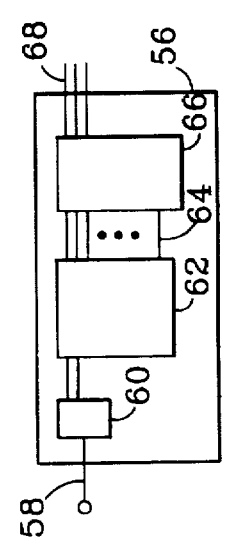
FIG. 9 is a block diagram of an ADC which incorporates the novel ladder/comparator circuit.

An ADC 56 which employs the novel ladder/comparator is illustrated in FIG. 9. An analog signal is connected to the analog input 58 and is converted from a single ended to differential signal by conversion circuit 60. Differential signals, such as Vin and $\overline{Vin}$, discussed previously, are connected to the new ladder/comparator circuit 62, which may optionally include the Re reduction current sources discussed in relation to FIG. 6. The ladder/comparator circuit 62 provides Q thermometer outputs 64, where Q is the number of levels resolvable by the ADC 56, i.e., $Q=2^n$ where n=the number of bits of the ADC. Digital section 66 includes an encoder which encodes the thermometer output of the ladder/comparator circuit into S outputs 68. The ADC 56 may employ any architecture that includes a parallel ADC, such as flash, subranging, etc.

Figure 10:
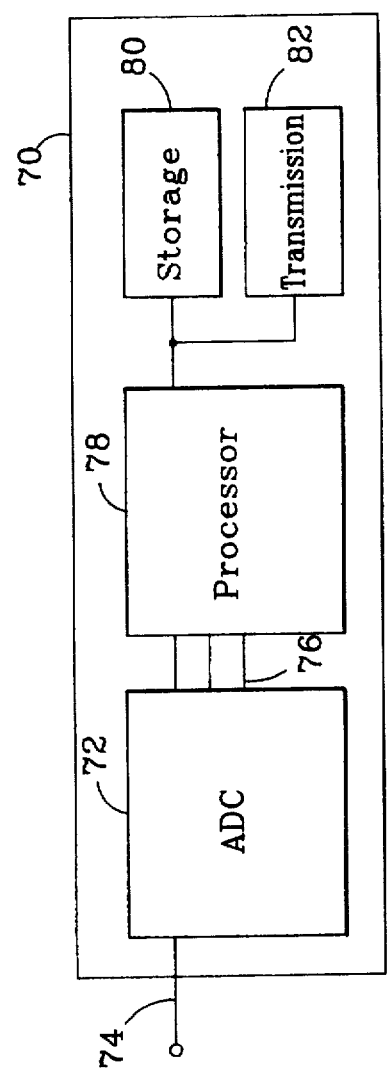
FIG. 10 is a block diagram of a signal processing system which includes an ADC based on the novel ladder/comparator circuit.

A signal processing system 70 illustrated in FIG. 10 includes an ADC 72 that employs the novel ladder/comparator circuit. An analog signal is accepted at an analog input 74 and converted by the ADC 72 into a digital code present at the output(s) 76. The output(s) 76 could be a serial or parallel interface to a processor 78. After receiving the digital converted signal from the ADC 72, the processor 78 may manipulate the signal received at input 74 to analyze, identify or compress it. The signal processing system may also include a storage system 80 or transmission system 82 connected to the processor 78. The storage system 80 may be a compact disk storage system, digital audio tape system, or other type. The transmission system 82 may be a broadcast system or a local or other type of network employing any of a variety of media, such as RF, optical waveguides, etc. to transmit the digital signals converted from analog signals by the ADC 72.

The forgoing description of specific embodiments of the invention has been presented for the purposes of illustration and description. It is not intended to be exhaustive or to limit the invention to the precise forms disclosed, and many modifications and variations are possible in light of the above teachings. For example, the ladder drivers could be implemented as pnp transistors or field effect transistors. The impedance improvements will vary, depending upon specific integrated circuit layouts, process variations and other factors such as square resistance and the minimum desired resistance value within a resistor ladder. The reduction of circuit area attributable to reduced resistor area and reduced interconnection area may permit the inclusion of more circuitry within one integrated circuit, thereby allowing the inclusion of one or more additional bits of resolution or, alternatively, the reduced circuit size will result in higher yields in integrated circuit manufacture. Connection of the inverting and noninverting inputs of the comparators could be reversed from that shown, yielding a "positive-going" thermometer output rather than the negative-going thermometer output illustrated.

The embodiments were chosen and described in order to best explain the principles of the invention and its practical application, to thereby enable others skilled in the art to best utilize the invention. It is intended that the scope of the invention be limited only by the claims appended hereto.

We claim:

1. A differential ladder/comparator circuit, comprising:
   a differential resistor ladder pair having N resistors and higher-order and lower-order taps on each ladder, and
   2N+1 comparators with respective inverting and non-inverting inputs, with at least N+1 of said comparators having their inverting inputs connected to the lower order taps of one of the differential ladders, and the same number of said comparators, including all of the remaining comparators and at least one of said first N+1 comparators, having their non-inverting inputs connected to the same lower order taps of the other differential ladder.

2. The differential ladder/comparator circuit of claim 1, wherein N+1 of said comparators have their inverting inputs connected to the lowest order tap of one of the differential ladders and N+1 of said comparators, including all of the remaining comparators and one of said first N+1 comparators, have their non-inverting inputs connected to the lowest order tap of the other differential ladder.

3. The differential ladder/comparator circuit of claim 1, further comprising differential ladder drivers having driver current sources connected to reduce the output impedance of said drivers.

4. An analog to digital converter, comprising:
   a differential resistor ladder pair having N resistors and higher-order and lower-order taps on each ladder,
   2N+1 comparators with respective inverting and non-inverting inputs, with N+1 of said comparators having their inverting inputs connected to the lowest order tap of one of the differential ladders, and N+1 of said comparators, including all of the remaining comparators and one of said first N+1 comparators, having their non-inverting inputs connected to the lowest order tap of the other differential ladder, said comparators providing thermometer scale outputs,
   respective current sources connected to each ladder to establish a current through each ladder, and
   a pair of differential drivers connected to receive an analog signal and to establish respective voltage offsets for the ladders in said pair which correspond to said analog signal.

5. The analog to digital converter of claim 4, further comprising driver current sources connected to reduce the output impedance of said drivers.

6. The analog to digital converter of claim 5, further comprising an encoder connected to receive the thermometer scale outputs from said comparators and to produce digital-encoded outputs reflective of said thermometer scale output.

7. A 1/(2N+2) resolution analog-to-digital converter, comprising:

a differential resistor ladder pair having N resistors and higher-order and lower-order taps on each ladder, 2N+1 comparators with respective inverting and non-inverting inputs, with at least N+1 of said comparators having their inverting inputs connected to the lower-order taps of one of the differential ladders, and the same number of said comparators, including all of the remaining comparators and at least one of said first N+1 comparators, having their non-inverting inputs connected to the same lower-order taps of the other differential ladder, said comparators providing thermometer scale outputs, respective current sources connected to each ladder to establish a current through each ladder, a pair of differential drivers connected to receive an analog signal and to establish respective voltage offsets for the ladders in said pair which correspond to said analog signal, and an encoder connected to receive the thermometer scale outputs from said comparators and to produce digital-encoded outputs reflective of said thermometer scale output.

8. The analog to digital converter of claim 7, wherein N+1 of said comparators have their inverting inputs connected to the lowest order tap of one of the differential ladders and N+1 of said comparators, including all of the remaining comparators and one of said first N+1 comparators, have their non-inverting inputs connected to the lowest order tap of the other differential ladder.

9. The analog to digital converter of claim 8, further comprising driver current sources connected to reduce the output impedance of said drivers.

10. The analog-to-digital converter of claim 8, wherein said drivers comprise bipolar transistors connected as emitter followers that supply a predetermined current to a corresponding resistor ladder, said predetermined current fixed by said current source, said drivers further superposing a voltage corresponding to said analog input voltage upon said resistor ladders.

11. The analog-to-digital converter of claim 7, wherein said analog-to-digital converter is a flash converter.

12. The analog-to-digital converter of claim 7, wherein said analog-to-digital converter is a subranging converter.

13. A signal processing system, comprising:

an analog to digital converter including a differential resistor ladder pair having N resistors and higher-order and lower-order taps on each ladder, 2N+1 comparators with respective inverting and non-inverting inputs, with at least N+1 of said comparators having their inverting inputs connected to the lower-order taps of one of the differential ladders, and the same number of said comparators, including all of the remaining comparators and at least one of said first N+1 comparators, having their non-inverting inputs connected to the same lower-order taps of the other differential ladder, said comparators providing thermometer scale outputs, respective current sources connected to each ladder to establish a current through each ladder, a pair of differential drivers connected to receive an analog signal and to establish respective voltage offsets for the ladders in said pair which correspond to said analog signal, an encoder connected to receive the thermometer scale outputs from said comparators and to produce digital-encoded outputs reflective of said thermometer scale output, and a processor connected to receive and process said digital signals.

14. The signal processing system of claim 13, further comprising a storage system connected to receive said digital signal from said processor.

15. The signal processing system of claim 13, further comprising a transmission system connected to receive said digital signal from said processor and to transmit said digital signal.

16. A differential ladder/comparator circuit, comprising:

2N+1 comparators having respective inverting and non-inverting inputs; and a differential resistor ladder pair having less than 2N resistors connected in series between higher-order and lower-order taps on each ladder, a plurality of said comparators having their inverting inputs connected to the same lower-order tap of one of the differential ladders, and the same number of other said comparators having their non-inverting inputs connected to the same lower-order tap of the other differential ladder.

17. The differential ladder/comparator circuit of claim 16, wherein there are at most N resistors in each said ladder, at least N+1 of said comparators having their inverting inputs connected to the lower-order taps of one of the differential ladders, and the same number of said comparators, including all of the remaining comparators and at least one of said first N+1 comparators, having their non-inverting inputs connected to the same lower-order taps of the other differential ladder.

18. The differential ladder/comparator circuit of claim 16, wherein each ladder includes N resistors, N+1 of said comparators having their inverting inputs connected to the lowest order tap of one of the differential ladders, and N+1 of said comparators, including all of the remaining comparators and one of said first N+1 comparators, having their non-inverting inputs connected to the lowest order tap of the other differential ladder.

\* \* \* \* \*